United States Patent

[11] 3,557,309

[72] Inventor Cecil R. Graham
R.F.D. #1, Wingdale, N.Y. 12594

[21] Appl. No. 672,076
[22] Filed Oct. 2, 1967
[45] Patented Jan. 19, 1971

[54] AMPLIFIER WITH AUTOMATIC GAIN CONTROL
10 Claims, 3 Drawing Figs.

[52] U.S. Cl. .......... 179/1, 325/410, 411
[51] Int. Cl. .......... H03g 3/12, H03g 3/30
[50] Field of Search .......... 179/1A, 1F; 325/410, 411, 400; 330/26

[56] References Cited

UNITED STATES PATENTS

| | | | |
|---|---|---|---|
| 2,570,715 | 10/1951 | Robinson | 325/410 |
| 2,957,074 | 10/1960 | Trevor | 325/411 |
| 3,089,087 | 5/1963 | Birkenes | 325/400 |
| 3,267,388 | 8/1966 | Finkey et al. | 325/410 |
| 3,328,714 | 6/1967 | Hugenholtz | 325/410 |

*Primary Examiner*—Kathleen H. Claffy
*Assistant Examiner*—Douglas W. Olms
*Attorneys*—Clarence A. O'Brien and Harvey B. Jacobson

ABSTRACT: A solid state amplifier supplying a modulating signal to a transmitter or audio reproducing device with an automatically varied gain to maintain a substantially constant output range. Audio inputs to the amplifier from microphones of different impedance values are accommodated by a sliding switch control that changes the impedance of the coupling circuit between the microphone and the initial amplifier stage. A field effect transistor is employed in a signal attenuating network to limit the gain of an automatically controlled amplifier stage coupled to the amplifier output through an impedance matching network monitored by the signal attenuating network.

Cecil R. Graham
INVENTOR.

BY Clarence A. O'Brien
and Harvey B. Jacobson
Attorneys

AMPLIFIER WITH AUTOMATIC GAIN CONTROL

This invention relates to gain-controlled amplifiers of the low or audio frequency type and more particularly to a solid state amplifier, the output of which is maintained within a predetermined output range despite excessive variations in the level of the audio input signal or changes in the impedance of the input transducer.

While automatic gain control for audio amplifiers is well known in the electronic arts, a specialized problem exists in connection with regulating the gain of an audio amplifier in order to maintain a constant output range where in input signal level to the amplifier may vary because of changes in the location of the sound source. Further, replacement of the transducer with a corresponding change in input impedance should also be accommodated so that the amplifier may be used with different types of transducers or microphones.

In accordance with the present invention, the amplifier is provided with an initial stage that is coupled to the transducer input through an impedance changing coupling circuit having a sliding switch assembly through which the windings of a signal transformer may be bypassed or a signal coupling capacitor bypassed in order to change the impedance, and thereby accommodate low, medium or high impedance microphones. The output of the initial amplifier stage is then further amplified by a gain controlled amplifier stage in order to supply an amplified audio output signal to a transmitter, a speaker or other audio reproducing device through an impedance matching network. The output from the impedance matching network is monitored so that any excessive signal level will change the source to drain resistance of a field effect transistor connected to ground in shunt relation to a coupling between the source and the gain controlled amplifier stage thereby automatically limiting the level of the signal fed to the impedance matching network through which an audio modulating signal is fed to the transmitter or other device.

These together with other objects and advantages which will become subsequently apparent reside in the details of construction and operation as more fully hereinafter described and claimed, reference being had to the accompanying drawings forming a part hereof, wherein like numerals refer to like parts throughout, and in which:

Figures 1, 2, 3:
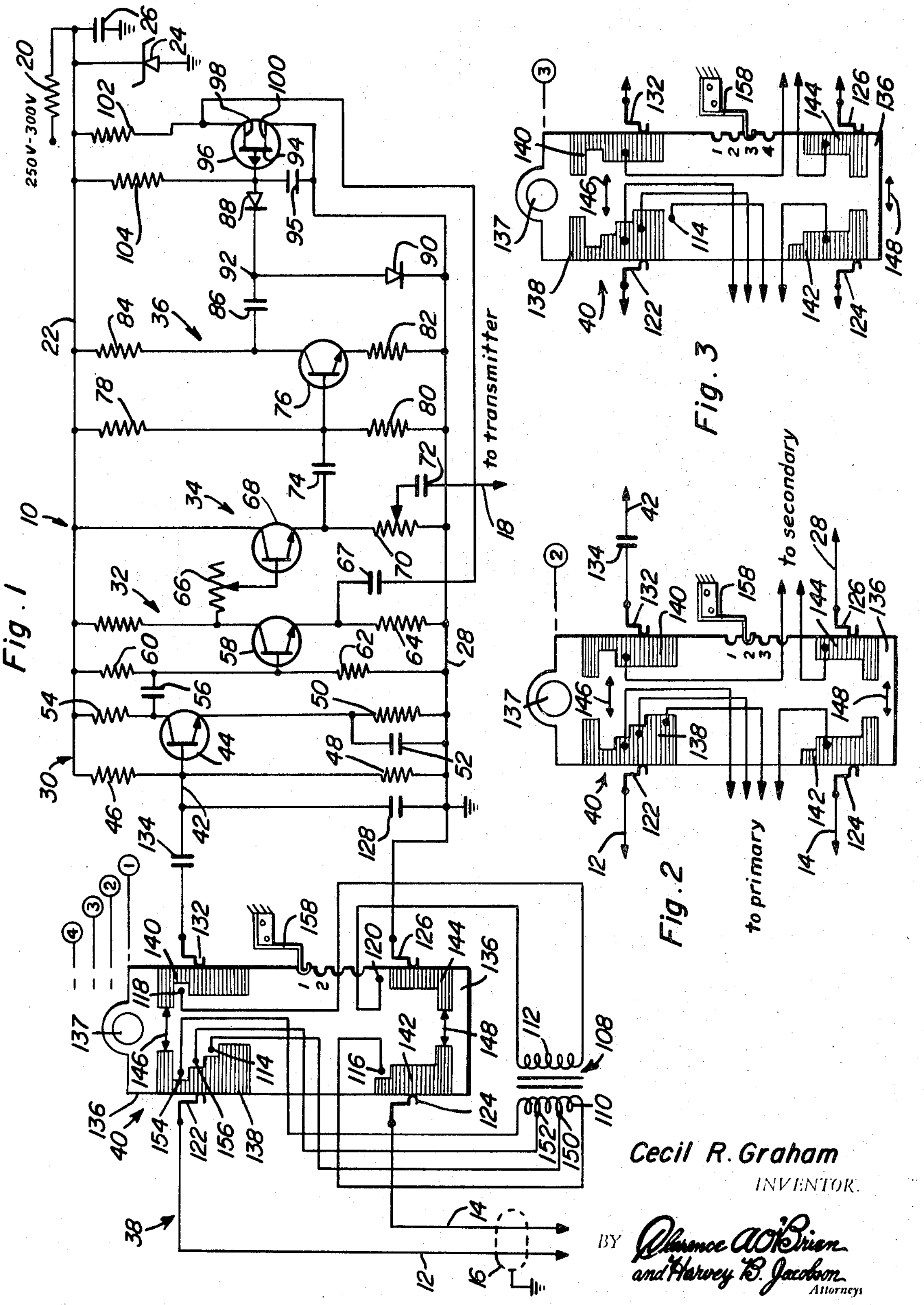
FIG. 1 is an electrical circuit diagram illustrating the audio amplifier circuit of the present invention.
FIG. 2 is a partial circuit diagram showing the impedance changing switch assembly associated with the amplifier circuit in another operative position from that shown in FIG. 1.
FIG. 3 is a partial circuit diagram showing the impedance changing switch assembly in a third operative position.

Referring now to the drawings in detail, FIG. 1 illustrates the solid state amplifier circuit of the present invention generally referred to by reference numeral 10. An audio input signal is supplied to the amplifier circuit from any suitable source or transducer such as a microphone through the input signal lines 12 and 14 that are provided with shielding 16. An audio modulating output signal is fed to a transmitter for example from the amplifier circuit through the output line 18. A suitable DC voltage is supplied to the amplifier circuit through the voltage reducing resistor 20 supplying a positive voltage to the voltage line 22, the voltage level in line 22 being regulated by the grounded Zener diode 24 connected in shunt relation to the capacitor 26. Reference ground on the other hand is connected to the ground line 28 so as to establish operating bias for the various components of the amplifier circuit.

The amplifier circuit includes an initial amplifier stage generally referred to by reference numeral 30 operative to amplify signals only within the audio frequency range for which the amplifier circuit is designed. The amplifier output of the initial amplifier stage is fed to a gain controlled amplifier stage generally referred to by reference numeral 32 from which the amplified output is fed to the output line 18 through an impedance matching network generally referred to by reference numeral 34. The output of the impedance matching network 34 is monitored by a signal attenuating network 36 through which the gain of the amplifier stage 32 is automatically controlled in order to limit the output to a predetermined signal level range. Thus, any excessive change in the signal level will produce a corresponding change in the gain of the amplifier stage 32 in order to maintain substantially constant signal level limits. In this regard, it will be appreciated that excessive changes in the signal level may occur when the transducer is moved too far or too close to the sound source being reproduced. Further, the input signal from the transducer is supplied to the initial amplifier stage 30 through an input coupling circuit section generally referred to by reference numeral 38, the impedance of which may be changed by means of a sliding switch assembly generally denoted by reference numeral 40 in a manner to be hereinafter explained in detail.

The audio input signal is supplied to the initial amplifier stage 30 through an input signal line 42 connected to the base of an NPN type transistor 44 disposed in a common emitter configuration. Accordingly, base bias is established for the base of transistor 44 through the voltage dividing resistors 46 and 48 respectively connected to the positive voltage line 22 and ground line 28. The emitter of transistor 44 is biased to a level above ground through the emitter resistor 50 shunted by a high frequency bypass capacitor 52 so as to limit amplification to the low or audio frequency range. Collector bias for the output collector of transistor 44 is established by the resistor 54 connected between the collector and the positive voltage line 22. Thus, an amplified audio output signal will be fed to the gain controlled amplifier stage 32 through the signal coupling capacitor 56 connected to the output collector of transistor 44.

The amplifier stage 32 also includes an NPN type transistor 58, the input base of which is connected to the output of the initial amplifier stage 30. Base bias for the transistor 58 is established through the voltage dividing resistors 60 and 62 while emitter bias is established through the resistor 64. The gain of the amplifier stage 32 is controlled through signal coupling capacitor 67 connected to the emitter of transistor 58. Thus, a controlled amplified output is fed from the collector of transistor 58 to the impedance matching network 34 through a fine tuning potentiometer 66 by means of which the signal level volume may be adjusted.

The network 34 is adapted to match the high input impedance of amplifier stage 32 to a low output impedance for the output line 18 through which the amplified audio output signal is applied to the transmitter. Toward this end, the network 34 includes an NPN type transistor 68 disposed in an emitter follower configuration wherein the collector is connected to the regulated voltage line 22 and bias is established for the output emitter through the resistance of the volume controlling potentiometer 70. The input to the base of transistor 68 is connected to the potentiometer 66 through which the amplified output of the preceding amplifier stage 32 is fed to the impedance matching network. While the output signal is supplied to the output line 18 from the potentiometer 70 through the signal coupling capacitor 72, it is simultaneously sampled through the signal coupling capacitor 74 directly connected to the output emitter of the transistor 68. Monitoring of the signal output of the amplifier is thereby effected by means of the signal attentuating network 36.

The signal attenuating network includes a amplifier transistor 76 of the NPN type having an input base connected to the signal coupling capacitor 74. The base bias is maintained by means of the voltage dividing resistors 78 and 80 connected on either side of the base to the regulated voltage line 22 and ground line 28. Emitter bias is established through the resistor 82 while collector bias is maintained by resistor 84. An amplified attenuating signal at the collector is fed to the signal coupling capacitor 86. Thus, any excessive change in the signal level transmitted to the impedance matching network 34 will be further amplified so as to render the diodes 88 and 90 conductive. The signal coupling capacitor 86 is connected to the juncture 92 between the diodes 88 and 90 unidirectional connected in series between the ground line 28 and the control terminator gate 94 of a field effect transistor 96 having power terminals consisting of a source terminal 98 and a drain terminal 100 connected to the ground line. Filter capacitor 95 is connected between the gate 94 and the ground line. Bias voltage is applied to the source 98 from the voltage line 22 through the resistor 102 while a relatively high resistance resistor 104 connects the voltage line 22 to the gate 94 to prevent unintentional shunting of the source to drain path through the transistor 96. As is well-known by those skilled in the art, the static resistance of the transistor 96 between the source 98 and drain 100 is a function of the potential difference between the gate 94 and the source 98. Accordingly, a signal voltage applied to the gate 94 will alter the static resistance between the source and drain in order to control the flow of current through the gain control line connected between the source 98 and the capacitor 67 associated with the emitter of transistor 58 in the gain controlled amplifier stage 32.

The audio input signal is supplied to the input line 42 at the initial amplifier stage 30 through the input coupling section 38 which includes a signal coupling transformer 108 having a primary winding 110 and a secondary winding 112. The terminals of primary winding 110 are connected to the contacts 114 and 116 associated with the sliding switch assembly 40 while the secondary winding 112 is connected between the contacts 118 and 120 of the switch assembly. Primary winding taps 150 and 152 are connected to contacts 154 and 156 while the input signal lines 12 and 14 are respectively connected to the contacts 122 and 124 in the switch assembly. The ground line 28 is connected to the contact 126 in the switch assembly while the signal input line 42 is connected to the ground filter capacitor 128. The switch assembly 40 includes a nonconductive slide 136 adapted to be displaced between three operative positions by a knob 137 so that the aforementioned contacts may be selectively engaged by contact plates 138, 140, 142, and 144. Also, in one of the positions as illustrated in FIG. 1, the contact plates 138 and 140 are bridged by the stationary short circuit bar 146 while the contact plates 142 and 144 are bridged by the stationary bar 148.

In the low impedance position illustrated in FIG. 1, the switch assembly 40 directly connects the input lines 12 and 14 to the signal coupling capacitor 134 and ground line 28 bypassing the windings 110 and 112 of the transformer 108. In this position, very low impedance microphones are accommodated. When the switch assembly is displaced to a second operative position as illustrated in FIG. 2, medium low impedance microphones are accommodated since in this position, the input lines 12 and 14 are connected across a portion of the primary winding 110 between tap 150 and terminal contact 116 by engagement of contact plate 138 with contacts 154, 156 and 114. The terminals of the second winding 112 are then respectively connected to the signal coupling capacitor 134 and the ground line 28. For medium high impedance microphones, the sliding switch assembly is displaced to its third position illustrated in FIG. 3. In this position, the plate 138 disengages contact 114 so that the signal input lines 12 and 14 are connected across a larger portion of the primary winding 110 between tap 152 and contact 116. In a fourth position of the switch assembly (not shown), contact plate 138 electrically connects lines 12 and 14 across the entire winding of the primary 110 through contacts 154 and 116 for high impedance microphones. The detent 158 yieldably holds the slide 136 in any of the four operative positions described.

From the foregoing description, the arrangement of the amplifier circuit and operation thereof will be apparent. In summary, an input signal applied to the base of transistor 44 will be amplified at its output collector if it is within the audio frequency range handled by the amplifier circuit in order to supply an amplified input to the gain controlled amplifier stage 58. The gain of the amplifier transistor 58 is controlled through the capacitor 67 connected to the emitter supplying an amplified signal to the output line 18 through the impedance matching network 34. The output signal at the emitter of transistor 68 is at the same time monitored by the signal attenuating network. If an excessive increase in the signal level occurs, the normally nonconductive diodes 88 and 90 are rendered conductive in order to apply a control signal to the gate 94 of the field effect transistor 96. Thus, if the output signal level is too large, the voltage at the gate 94 goes negative to increase the drain to source resistance of the transistor 96 and thereby varies the voltage applied through capacitor 67 to the emitter of transistor 58. The gain of the transistor amplifier 58 is thereby decreased in order to restore the signal level to the desired range.

Use of the amplifier circuit of the present invention is made extremely versatile by the multiposition, impedance changing switch assembly 40 in accommodating most transducer or microphone impedances supplying input to amplifiers associated with television or radio transmitters of all types, public address systems, stereo or monaural recording equipment and including single or multichannel systems. The impedance of the tapped portions of the transformer winding are designed accordingly. The adjusting controls 66 and 70 will also provide fine tuning to compensate for changes made in the input impedance.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention as claimed.

I claim:

1. An amplifier assembly for an input signal source having significantly different input impedances, including a variable gain amplifier connected to the input signal source, impedance matching means connected to the variable gain amplifier establishing a low impedance path for amplified output signals, means connected to the impedance matching means for sampling the output signals conducted therethrough, a regulated source of voltage, a resistor connected to said source means coupling said source of voltage through the resistor to the variable gain amplifier, signal varied resistive means connected in parallel with the coupling means for limiting the signal gain of the variable gain amplifier, and attenuating means connecting the sampling means to the signal varied resistive means for varying the resistance thereof when the signal level of said output signals exceeds a limiting value to reduce the signal gain of the variable gain amplifier.

2. The combination of claim 1 wherein said signal varied resistive means comprises a field effect transistor having a gate, a drain connected to ground and a source connected to the coupling means, said attenuating means including a pair of directionally aligned and series connected diodes respectively connected to the gate and ground and an input juncture connecting opposite terminals of the diodes to the sampling means.

3. The combination of claim 2 including an audio frequency amplifying stage connecting the signal source to the variable gain amplifier, said signal source including an impedance changing input assembly coupled to the audio frequency amplifying stage.

4. The combination of claim 3 wherein said input assembly comprises s signal transformer having a primary winding and a secondary winding, a signal coupling capacitor connecting the audio frequency amplifying stage to said secondary winding, and impedance controlling switch means for selectively bypassing portions of the primary winding or both transformer windings.

5. The combination of claim 1 including a low frequency amplifying stage connecting the signal source to the variable gain amplifier, said signal source including an impedance changing input assembly coupled to the low frequency amplifying stage.

6. An audio amplifier assembly for supplying a gain-controlled modulating signal comprising a pair of series connected transistor stages in common-emitter configurations having input bases, output collectors and emitters, a high frequency bypass capacitor connected to the emitter of a first of the transistor stages, an emitter-follower transistor having an output emitter and a base coupled to the collector of the second of said transistor stages, a control signal amplifier coupled to the output emitter of said emitter-follower transistor, a field effect transistor having a biased gate, a source and a drain connected to ground, a pair of diodes unidirectionally connected in series between ground and said gate forming a juncture coupled to the output of the control signal amplifier, and a gain controlling capacitor connecting the source of the field effect transistor to the emitter of said second of the transistor stages.

7. The combination of claim 1 wherein said signal varied resistive means comprises a current conducting device having power terminals directly connected between ground and said source of voltage in parallel relation to the coupling means and a control terminal for maintaining a predetermined static resistance between the power terminals while the signal level of the output signals is below said limiting value, the static resistance being determined by the potential difference between the source of voltage and the control terminal.

8. The combination of claim 1 wherein said attenuating means includes diode means connected between the control terminal and ground for normally blocking voltage signals from the monitoring means and signal amplifying means connected to the monitoring means for rendering the diode means conductive in response to output signals exceeding said limiting value to change the static resistance of the signal varied resistive means.

9. The combination of claim 8 wherein said signal source includes an input signal transformer having a tapped primary winding and a secondary winding, a pair of input terminals, a pair of output terminals coupled to the amplifier assembly and a switch device displaceable between a plurality of operative positions in electrical contact with the input and output terminals, said switch device having means for establishing direct conductive paths between the input and output terminals in one of the operative positions, means for electrically connecting the input terminals across different tapped portions of the primary winding in the other of the operative positions and means for electrically connecting the output terminals across the secondary winding in said other of the operating positions.

10. The combination of claim 1 wherein said signal source includes an input signal transformer having a tapped primary winding and a secondary winding, a pair of input terminals, a pair of output terminals coupled to the amplifier assembly and a switch device displaceable between a plurality of operative positions in electrical contact with the input and output terminals, said switch device having means for establishing direct conductive paths between the input and output terminals in one of the operative positions, means for electrically connecting the input terminals across different tapped portions of the primary winding in the other of the operative positions and means for electrically connecting the output terminals across the secondary winding in said other of the operating positions.